United States Patent
Kim

(10) Patent No.: US 8,564,002 B2
(45) Date of Patent: Oct. 22, 2013

(54) ORGANIC LIGHT EMITTING DISPLAY DEVICE AND METHOD FOR MANUFACTURING THE SAME

(75) Inventor: Dae-Woo Kim, Yongin (KR)

(73) Assignee: Samsung Display Co., Ltd., Giheung-Gu, Yongin, Gyeonggi-Do (KR)

( * ) Notice: Subject to any disclaimer, the term of this patent is extended or adjusted under 35 U.S.C. 154(b) by 74 days.

(21) Appl. No.: 13/172,267

(22) Filed: Jun. 29, 2011

(65) Prior Publication Data

US 2012/0168764 A1 Jul. 5, 2012

(30) Foreign Application Priority Data

Jan. 5, 2011 (KR) .................. 10-2011-0001080

(51) Int. Cl.
*H01L 33/00* (2010.01)

(52) U.S. Cl.
USPC ................ 257/98; 257/40; 257/59; 257/72

(58) Field of Classification Search
USPC .......................... 257/40, 98, 59, 72
See application file for complete search history.

(56) References Cited

U.S. PATENT DOCUMENTS 8,144,086 B2 * 3/2012 Lee et al. .................. 345/82
2003/0184705 A1 * 10/2003 Murade et al. ............ 349/158

FOREIGN PATENT DOCUMENTS

| KR | 10-0588868 | 6/2006 |
| KR | 10-0729042 | 6/2007 |
| KR | 10-2009-0108285 | 10/2009 |
| KR | 10-2010-0078340 | 7/2010 |

* cited by examiner

*Primary Examiner* — Tan N Tran
(74) *Attorney, Agent, or Firm* — Robert E. Bushnell, Esq.

(57) ABSTRACT

An organic light emitting display device and a method for manufacturing the same are provided. The organic light emitting display device includes a substrate including a capacitor region, a buffer layer disposed on the substrate, a semiconductor layer disposed on the buffer layer of the capacitor region, a gate insulation film formed on the semiconductor layer, and a transparent electrode formed on the gate insulation film of the capacitor region, wherein a cross-sectional width of the transparent electrode is smaller than a width of the semiconductor layer.

25 Claims, 12 Drawing Sheets

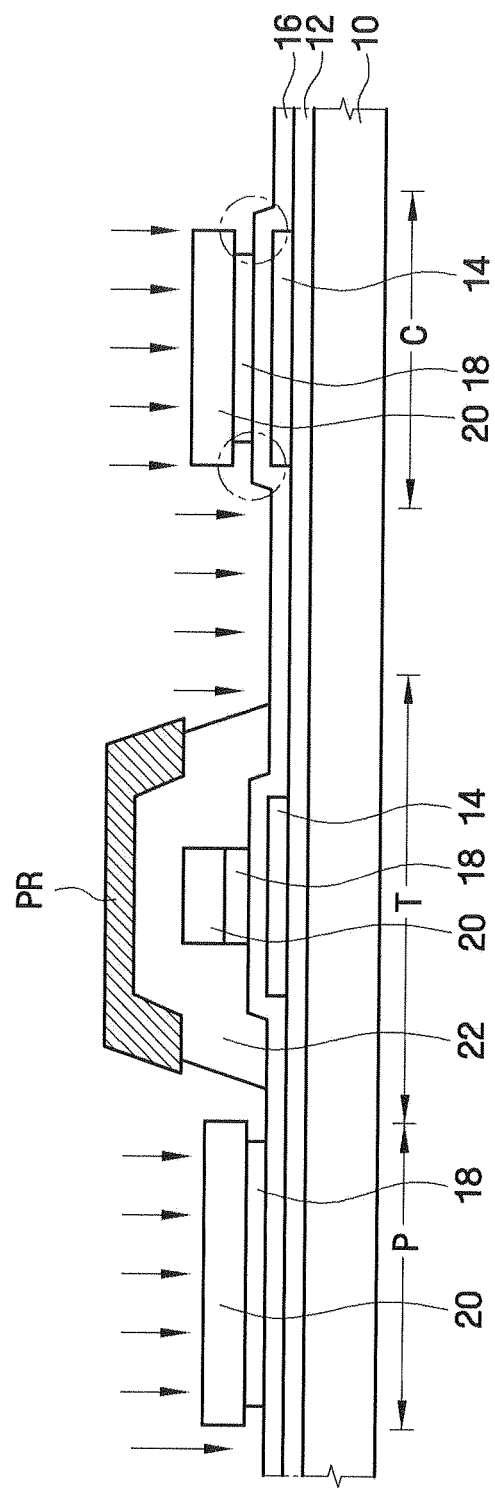

ORGANIC LIGHT EMITTING DISPLAY DEVICE AND METHOD FOR MANUFACTURING THE SAME

CLAIM OF PRIORITY

This application makes reference to, incorporates the same herein, and claims all benefits accruing under 35 U.S.C. §119 from an application earlier filed in the Korean Intellectual Property Office on 5 Jan. 2011 and there duly assigned Serial No. 10-2011-0001080.

BACKGROUND OF THE INVENTION

1. Field of the Invention

The present invention relates to an organic light emitting display device and a method for manufacturing the same, and more particularly, to an organic light emitting display device configured to prevent shorts from being generated in a capacitor region and a pixel region, and a method for manufacturing the organic light emitting display device.

2. Description of the Related Art

According to a proliferation of display devices along with the rapid advances in the information communication industry, display devices, meeting requirements of low power consumption, lightness in weight, slimness, a high resolution, and so on, have recently been required. To keep up the pace with such requirements, liquid crystal displays or organic light emitting displays using organic electroluminescence are being developed.

An organic light emitting display is a next-generation display device having a self-emissive characteristic, and is superior in view of viewing angle, contrast, response speed, and power consumption, compared to a liquid crystal display. In addition, the organic light emitting display does not require a back light, so that it can be produced as a lightweight, slim display.

The organic light emitting display includes a substrate that provides for a pixel region and a non-pixel region, and a container or a member disposed to face the substrate and adhering to the substrate by a sealant made of, for example, epoxy, for encapsulation. A plurality of light emitting devices forming pixels are formed between scan lines and data lines in the pixel region of the substrate in a matrix type. In the non-pixel region, scan lines and data lines extending from the scan and data lines of the pixel region, power voltage supply lines for operating the organic light emitting display, and a scan driver and a data driver for processing signals externally supplied through an input pad and supplying the processed signals to the scan lines and the data lines.

The organic light emitting display includes a pixel region, a transistor region and a capacitor region that maintains a driving voltage at a constant level. A conventional capacitor is formed by allowing a gate electrode and portions of source/drain electrodes for forming a thin film transistor to remain in the capacitor region.

Recently, an IOS capacitor is formed by allowing a semiconductor layer and a portion of a transparent electrode disposed on the semiconductor layer for forming a thin film transistor to remain in the capacitor region.

To form a capacitor using a transparent electrode, the transparent electrode and a gate electrode formed thereon are blanket etched. Here, the blanket etching of the transparent electrode and the gate electrode using a single etching stopper film allows the transparent electrode 5 formed under the gate electrode 6 to protrude outwardly relative to the gate electrode 6, as shown in FIG. 1a.

Since the thus-formed transparent electrode 5 protrudes outwardly relative to the upper gate electrode 6, a portion of the when the transparent electrode 5 may be etched in a subsequent process in which the interlayer dielectric film 7 is formed and patterned using the same, thereby forming a byproduct of the transparent electrode 5. Since the byproduct of the transparent electrode 5 is a conductive material, unintended electrostatic discharge (ESD) or electric short may be generated. The transparent electrode 5 is formed not only in the capacitor region but in the pixel region. As described above, since the blanket etching of the transparent electrode 5 in the pixel region and the gate electrode 6 allows ends of the transparent electrode 5 to protrude outwardly relative to the gate electrode 6, the ESD or electric short may be generated, like in patterning the interlayer dielectric film 7.

Further, as shown in FIG. 1b, in a case where the portion of the lower gate insulation film 4 is also etched when the interlayer dielectric film 7 is formed on the capacitor region C, a terminal portion of the transparent electrode 5 disposed on the gate insulation film 4 may sag downwardly or may get closer or come into contact with the semiconductor layer 3 exposed by the etched gate insulation film 4, resulting in a high risk of short defect S.

SUMMARY OF THE INVENTION

The present invention provides an organic light emitting display device configured to prevent shorts from being generated in a capacitor region and a pixel region.

The present invention also provides a method for manufacturing the organic light emitting display device.

The above and other objects of the present invention will be described in or be apparent from the following description of the preferred embodiments.

According to an aspect of the present invention, there is provided an organic light emitting display device including a substrate including a capacitor region, a buffer layer disposed on the substrate, a semiconductor layer disposed on the buffer layer of the capacitor region, a gate insulation film formed on the semiconductor layer, and a transparent electrode formed on the gate insulation film of the capacitor region, wherein a cross-sectional width of the transparent electrode is smaller than a width of the semiconductor layer.

According to another aspect of the present invention, there is provided an organic light emitting display device including a substrate including a capacitor region and a transistor region, a buffer layer disposed on the substrate, a semiconductor layer disposed on the buffer layer of the capacitor region and the buffer layer of the transistor region, a gate insulation film formed on the semiconductor layer, a transparent electrode formed on the gate insulation film of the capacitor region and the gate insulation film of the transistor region, a gate electrode formed on the transparent electrode of the transistor region, and a source/drain electrode disposed on the gate electrode while being insulated from the gate electrode, and connected to the semiconductor layer of the transistor region through a contact hole, wherein a cross-sectional width of the transparent electrode of the capacitor region is smaller than that of the semiconductor layer of the capacitor region.

According to still another aspect of the present invention, there is provided a method for manufacturing an organic light emitting display device including, the method including forming a semiconductor layer on a buffer layer formed on a capacitor region of a substrate including the capacitor region, sequentially forming a gate insulation film, a transparent electrode and a gate electrode on the semiconductor layer, forming a first etching stopper film on the capacitor region, etching the gate electrode formed on a region other than the first etching stopper film, and removing the first etching stopper film and etching the transparent electrode using the gate electrode as an etch mask so that the transparent electrode is inwardly recessed into the gate electrode.

According to a further aspect of the present invention, there is provided a method for manufacturing an organic light emitting display device, the method including forming a semiconductor layer on a buffer layer formed on the capacitor region of a substrate having a capacitor region and a transistor region, sequentially forming a gate insulation film, a transparent electrode and a gate electrode on the semiconductor layer, forming a first etching stopper film on the capacitor region, etching a gate electrode formed on a region other than a region of the first etching stopper film, removing the first etching stopper film and etching the transparent electrode to be inwardly recessed relative to the gate electrode using the gate electrode as an etch mask, providing an interlayer dielectric film on the substrate, and forming a second etching stopper film on the transistor region and etching the interlayer dielectric film formed on a region other than a region of the second etching stopper film, wherein in the etching of the interlayer dielectric film, the transparent electrode is prevented from being etched by the gate electrode.

BRIEF DESCRIPTION OF THE DRAWINGS

A more complete appreciation of the invention, and many of the attendant advantages thereof, will be readily apparent as the same becomes better understood by reference to the following detailed description when considered in conjunction with the accompanying drawings in which like reference symbols indicate the same or similar components, wherein.

DETAILED DESCRIPTION OF THE INVENTION

Figure 1A:
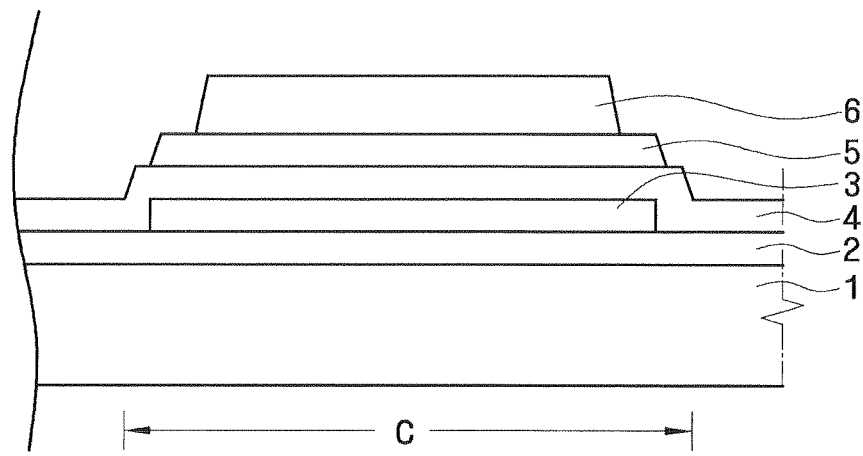
FIGS. 1a and 1b are cross-sectional views of capacitor regions of a conventional organic light emitting display device.

Advantages and features of the present invention and methods of accomplishing the same may be understood more readily by reference to the following detailed description of preferred embodiments and the accompanying drawings. The present invention may, however, be embodied in many different forms and should not be construed as being limited to the embodiments set forth herein. Rather, these embodiments are provided so that this disclosure will be thorough and complete and will fully convey the concept of the invention to those skilled in the art, and the present invention will only be defined by the appended claims. Thus, in some embodiments, well-known structures and devices are not shown in order not to obscure the description of the invention with unnecessary detail. Like numbers refer to like elements throughout. In the drawings, the thickness of layers and regions are exaggerated for clarity.

It will be understood that when an element or layer is referred to as being "on or "connected to" another element or layer, it can be directly on or connected to the other element or layer or intervening elements or layers may be present. In contrast, when an element is referred to as being "directly on" or "directly connected to" another element or layer, there are no intervening elements or layers present. As used herein, the term "and/or" includes any and all combinations of one or more of the associated listed items.

Spatially relative terms, such as "below," "beneath," "lower," "above," "upper," and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures.

Embodiments described herein will be described referring to plan views and/or cross-sectional views by way of ideal schematic views of the invention. Accordingly, the exemplary views may be modified depending on manufacturing technologies and/or tolerances. Therefore, the embodiments of the invention are not limited to those shown in the views, but include modifications in configuration formed on the basis of manufacturing processes. Therefore, regions exemplified in figures have schematic properties and shapes of regions shown in figures exemplify specific shapes of regions of elements and not limit aspects of the invention.

Hereinafter, the present invention will be described in further detail with reference to the accompanying drawings.

Figure 2A:
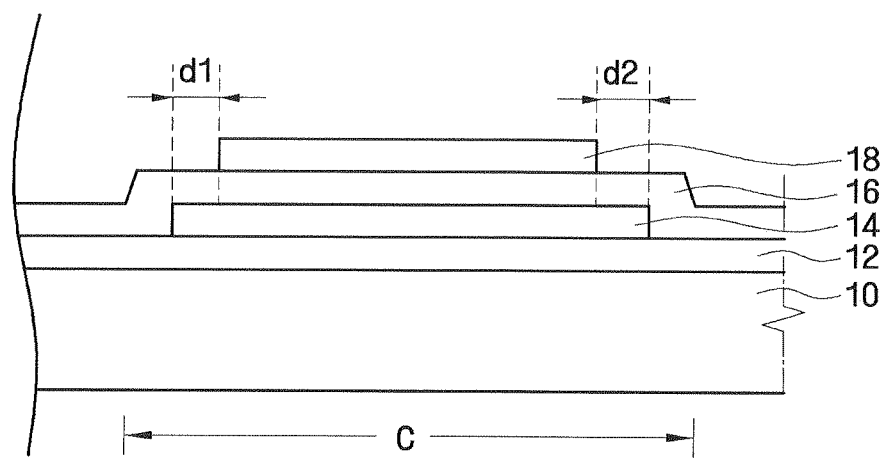
FIG. 2a is a cross-sectional view of an organic light emitting display device according to an embodiment of the present invention.

An organic light emitting display according to an embodiment of the present invention will now be described with reference to FIG. 2a. FIG. 2a is a cross-sectional view of an organic light emitting display device according to an embodiment of the present invention.

The illustrated organic light emitting display includes a substrate 10 having a capacitor region C, a buffer layer 12 disposed on the substrate 10, a semiconductor layer 14 disposed on the buffer layer 12 of the capacitor region C, a gate insulation film 16 formed on the semiconductor layer 14, and a transparent electrode 18 formed on the gate insulation film 16 of the capacitor region C. A cross-sectional width of the transparent electrode 18 is smaller than that of the semiconductor layer 14.

First, the substrate 10 may be made of a transparent glass material having SiO2 as a main component. However, the material of the substrate 10 is not limited to the transparent glass material, but may include a transparent plastic material. The transparent plastic material forming the substrate 10 may be an insulating organic material selected from the group consisting of polyether sulfone (PES), polyacrylate (PAR), polyether imide (PEI), polyethylene naphthalate (PEN), polyethyleneterephthalate (PET), polyphenylene sulfide (PPS), polyallylate, polyimide, polycarbonate (PC), cellulose triacetate (TAC), and cellulose acetate propionate (CAP).

In a case of a rear-surface light emitting type in which an image is implemented in a direction of the substrate 10, the substrate 10 should be made of a transparent material. However, in a case of a front-surface light emitting type in which an image is implemented in an opposite direction of the substrate 10, the substrate 10 does not have to be necessarily made of a transparent material. In the latter case, the substrate 10 may be made of a metal foil made of a transparent material. In a case where the substrate 10 is made of a metal, examples of the material forming the substrate 10 may include, but not limited to, at least one selected from the group consisting of carbon, iron, chrome, manganese, nickel, titanium, molybdenum, and stainless steel (SUS). The substrate 10 may be formed of a metal foil.

A buffer layer 12 for preventing smoothness of the substrate 10 and infiltration of impurity may further be formed on the substrate 10. The buffer layer 12 is provided on the entire surface of the substrate 10 and may be formed of a single layer of a silicon oxide film (SiO2), a silicon nitride film (SiNx), or a silicon oxynitride film (SiO2Nx), or multiple layers thereof.

The semiconductor layer 14 is formed on the buffer layer 12. The semiconductor layer 14 may be made of silicon (Si), that is, amorphous silicon (a-Si) or polysilicon (p-Si). The semiconductor layer 14 may also be made of germanium (Ge), gallium phosphorus (GaP), gallium arsenic (GaAs), or aluminum arsenic (AlAs), but not limited thereto. In addition, the semiconductor layer 14 may be a silicon semiconductor layer formed by diffusing n-type impurity into a silicon on insulator (SOI) substrate in a low concentration. Further, the semiconductor layer 14 may be a semiconductor layer formed by diffusing p- or n-type impurity into some portions of amorphous silicon.

In the illustrated embodiment, the semiconductor layer 14 is disposed on the capacitor region C of the substrate 10 and forms a capacitor together with the upper transparent electrode 18.

The gate insulation film 16 covering the semiconductor layer 14 and insulating the semiconductor layer 14 from the upper transparent electrode 18 is disposed on the semiconductor layer 14. Like the buffer layer 12, the gate insulation film 16 may be formed of a single layer of a silicon oxide film (SiO2), a silicon nitride film (SiNx) or a silicon oxynitride film (SiO2Nx), or multiple layers thereof. The gate insulation film 16 may be made of a material that is the same as or different from the buffer layer 12.

The transparent electrode 18 is formed on the gate insulation film 16 in the capacitor region C. As described above, the transparent electrode 18 forms a capacitor together with the lower semiconductor layer 14, and the capacitor allows the organic light emitting display to have a driving voltage maintained at a constant level.

The transparent electrode 18 may be made of a transparent conductive material. More preferably, the transparent conductive material may include at least one selected from indium tin oxide (ITO), indium zinc oxide (IZO), carbon nano tube, conductive polymer and nanowire. That is to say, the transparent electrode 18 may be made of a composite material prepared by mixing one or more of the transparent conductive materials.

In the illustrated embodiment, the transparent electrode 18 forms a capacitor together with the lower semiconductor layer 14. As shown in FIG. 2a, a cross-sectional width of the transparent electrode 18 is smaller than that of the semiconductor layer 14. In the illustrated embodiment, the transparent electrode 18 is recessed by d1 inwardly from the left end thereof and by d2 inwardly from the right end thereof relative to the semiconductor layer 14. That is to say, the width of the transparent electrode 18 is smaller by d1+d2 than that of the semiconductor layer 14. In detail, a difference between the widths of the transparent electrode 18 and the semiconductor layer 14 may be 0.6 μm or less.

Figure 1B:
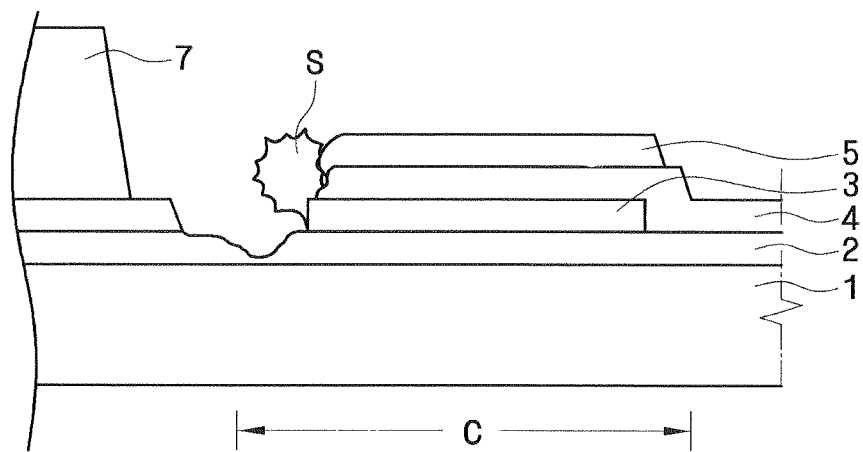

With this configuration, when the interlayer dielectric film 22 is provided on the entire surface of the substrate 10, which will later be described, and etched to form a transistor region T, the electric short S generated due to the sagging of the transparent electrode, as shown in FIG. 1b, can be prevented, and defects can be minimized. In addition, since the interlayer dielectric film 22 is recessed inwardly by d1+d2 relative to the gate electrode 20 stacked thereon when the interlayer dielectric film 22 is etched for patterning, it is possible to prevent a conductive byproduct from being generated due to etching of the transparent electrode 18, which will later be described with reference to FIG. 8c.

Figure 2B:
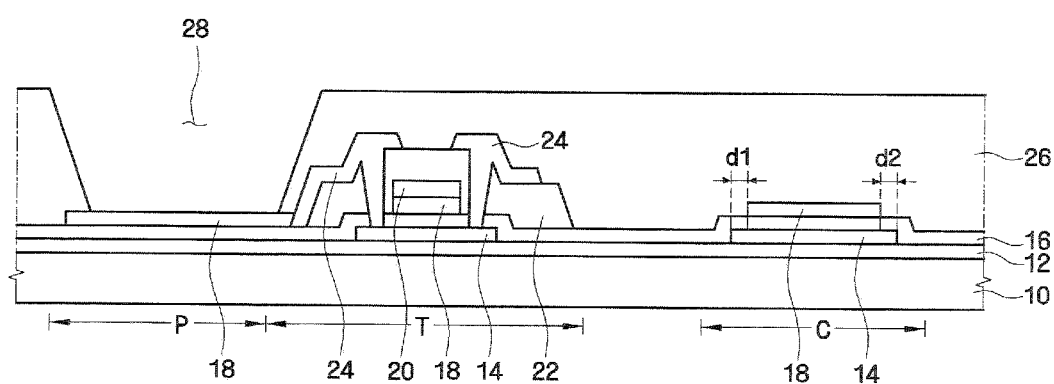
FIG. 2b is a cross-sectional view of an organic light emitting display device according to another embodiment of the present invention.

Hereinafter, an organic light emitting display device according to another embodiment of the present invention will be described with reference to FIG. 2b. FIG. 2b is a cross-sectional view of an organic light emitting display device according to another embodiment of the present invention.

The illustrated organic light emitting display includes a substrate 10 having a capacitor region C and a transistor region T, a buffer layer 12 disposed on the substrate 10, a semiconductor layer 14 disposed on the buffer layer 12 of the capacitor region C and on the buffer layer 12 of the transistor region T, a gate insulation film 16 formed on the semiconductor layer 14, a transparent electrode 18 formed on the gate insulation film 16 of the capacitor region C and on the gate insulation film 16 of the transistor region T, a gate electrode 20 formed on the transparent electrode 18 of the transistor region T, and insulated from the gate electrode 20, and source/drain electrode 24 disposed on the gate electrode 20 and connected to the semiconductor layer 14 of the transistor region T through a contact hole. A cross-sectional width of the transparent electrode 18 is smaller than that of the semiconductor layer 14 of the capacitor region C.

Since the substrate 10 and the buffer layer 12 formed thereon are the same as those of the previous embodiment, a detailed description thereof will be omitted. However, unlike in the previous embodiment, the substrate 10 may further include, in addition to the capacitor region C, a transistor region T having a thin film transistor formed thereon and an organic light emitting layer and a pixel region P in which light is emitted.

The semiconductor layer 14 is formed on the buffer layer 12. The semiconductor layer 14 may be made of silicon (Si), that is, amorphous silicon (a-Si) or polysilicon p-Si). The semiconductor layer 14 may also be made of germanium (Ge), gallium phosphorus (GaP), gallium arsenic (GaAs), or aluminum arsenic (AlAs), but not limited thereto. In addition, the semiconductor layer 14 may be a silicon semiconductor layer formed by diffusing n-type impurity into a silicon on insulator (SOI) substrate in a low concentration. Further, the semiconductor layer 14 may be a semiconductor layer formed by diffusing p- or n-type impurity into some portions of amorphous silicon.

The semiconductor layer 14 may be formed commonly on the transistor region T and the capacitor region C. Even if being formed by the same process, some structures of the semiconductor layer 14 formed on the transistor region T and the semiconductor layer 14 formed on the capacitor region C may be different, and effects thereof may be different accordingly.

That is to say, the semiconductor layer 14 formed on the transistor region T allows current to flow selectively to the source/drain electrode 24 according to the gate voltage applied to the gate electrode. Finally, driving current is applied to the transparent electrode 18 formed on the pixel region P, thereby allowing an organic light emitting layer provided on the pixel region P to emit light. Thus, the semiconductor layer 14 of the transistor region T may be a semiconductor layer that is only partially doped with impurity.

Meanwhile, the semiconductor layer 14 formed on the capacitor region C should be a conductor to form a capacitor together with the upper transparent electrode 18. Thus, the semiconductor layer 14 formed on the capacitor region C should be wholly doped with impurity, so that it may have a configuration of a conductor property.

As described above, the transparent electrode 18 forms a capacitor together with a lower semiconductor layer 14. As shown in FIG. 2b, a cross-sectional width of the transparent electrode 18 is smaller than that of the semiconductor layer 14. In the illustrated embodiment, the transparent electrode 18 is recessed by d1 inwardly from the left end thereof and by d2 inwardly from the right end thereof relative to the semiconductor layer 14. That is to say, the width of the transparent electrode 18 is smaller by d1+d2 than that of the semiconductor layer 14. In detail, a difference between the widths of the transparent electrode 18 and the semiconductor layer 14 may be 0.6 μm or less.

With this configuration, when the interlayer dielectric film 22 is provided on the entire surface of the substrate 10, which will later be described, and etched to form a transistor region T, the electric short S generated due to the sagging of the transparent electrode, as shown in FIG. 1b, can be prevented, and defects can be minimized. In addition, since the interlayer dielectric film 22 is recessed inwardly by d1+d2 relative to the gate electrode 20 stacked thereon when the interlayer dielectric film 22 is etched for patterning, it is possible to prevent a conductive byproduct from being generated due to etching of the transparent electrode 18, which will later be described with reference to FIG. 8c.

The gate insulation film 16 is disposed on the semiconductor layer 14, and the transparent electrode 18 is formed on the gate insulation film 16. Since the gate insulation film 16 and the transparent electrode 18 have the same configurations as those of the previous embodiment and a detailed description thereof will be omitted. However, the transparent electrode 18 is formed on the entire surface of the substrate 10. That is to say, the transparent electrode 18 is formed not only on the capacitor region C but on the transistor region T and the pixel region P.

The transparent electrode 18 in the capacitor region C forms a capacitor together with the semiconductor layer 14 doped with impurity to have a conductor property, the transparent electrode 18 in the transistor region T transfers a gate driving voltage together with the upper gate electrode 20, and the transparent electrode 18 in the pixel region P connected to the source/drain electrode 24 of the transistor region T receives the driving voltage forms a pixel portion to allow an organic light emitting layer to emit light.

Next, the gate electrode 20 is formed on the transparent electrode 18 in the transistor region T. The gate electrode 20 applies a gate signal and controls light emission by each pixel.

The gate electrode 20 may be formed of a single layer of aluminum (Al) or an aluminum alloy made of chrome-aluminum (Cr—Al), molybdenum-aluminum (Mo—Al), or aluminum-neodymium (Al—Nd), or multiple layers having an aluminum alloy stacked on a chrome (Cr) or aluminum (Al) alloy.

In the illustrated embodiment, the gate electrode 20 may have a triple layered structure of molybdenum-aluminum-molybdenum (Mo—Al—Mo), or a four layered structure of ITO-molybdenum-aluminum-molybdenum (ITO—Mo—Al—Mo) including the lower transparent electrode 18 made of ITO.

The interlayer dielectric film 22 is formed on the gate electrode 20. The interlayer dielectric film 22 electrically insulates the gate electrode 20 from the source/drain electrode 24. Like the buffer layer 12, the interlayer dielectric film 22 may be formed of a single layer of a silicon oxide film (SiO2), a silicon nitride film (SiNx), a silicon oxynitride film (SiO2Nx), or multiple layers thereof.

The source/drain electrode 24 electrically connected to the semiconductor layer 14 is formed on the interlayer dielectric film 22. Here, the source/drain electrode 24 may be made of at least one selected from the group consisting of molybdenum (Mo), chrome (Cr), tungsten (W), molybdenum tungsten (MoW), aluminum (Al), aluminum-neodymium (Al—Nd), titanium (Ti), titanium nitride (TiN), copper (Cu), a molybdenum alloy (Mo alloy), an aluminum alloy (Al alloy), and a copper alloy (Cu alloy). The source/drain electrode 24 is electrically connected to the semiconductor layer 14 and applies a voltage to the transparent electrode 18 of the pixel region P.

Next, a pixel defining layer (PDL) 26 may be formed on the entire surface of the substrate 10 excluding the pixel region P. The PDL 26 formed on the entire surface of the substrate 10 covers components in the transistor region T and the capacitor region C. The PDL 26 has an opening portion 28 exposing a portion of the transparent electrode 18 in the pixel region P to the outside to define a pixel portion. The PDL 26 may be an inorganic material, for example, silicon oxide (SiO2), silicon nitride (SiNx), silicon oxynitride (SiO2Nx). Alternatively, the PDL 26 may be formed of multiple layers of these materials.

Next, a method for manufacturing an organic light emitting display device according to an embodiment of the present invention will be described with reference to FIGS. 3 to 7c.

FIGS. 3 to 7c are cross-sectional views sequentially illustrating a method for manufacturing an organic light emitting display device according to an embodiment of the present invention.

The illustrated method for manufacturing an organic light emitting display device includes forming a semiconductor layer 14 on a buffer layer 12 formed on a capacitor region C of a substrate including the capacitor region C and a transistor region T, sequentially forming a gate insulation film 16, a transparent electrode 18 and a gate electrode 20 on the semiconductor layer 14, forming a first etching stopper film PR on the capacitor region C, etching the gate electrode 20 formed on a region other than the first etching stopper film PR, and removing the first etching stopper film PR and etching the transparent electrode 18 using the gate electrode 20 as an etch mask so that the transparent electrode 18 is inwardly recessed into the gate electrode 20.

Figure 3:
FIGS. 3 to 7c are cross-sectional views sequentially illustrating a method for manufacturing an organic light emitting display device according to an embodiment of the present invention.

Referring first to FIG. 3, the substrate 10 is provided and the buffer layer 12 is formed on the substrate 10. The capacitor region C, a pixel region P and the transistor region T are arbitrarily partitioned regions. The capacitor region C is a region forming a capacitor by allowing the transparent electrode 18 and the semiconductor layer 14 to remain on a region of the substrate 10 other than the transistor region T, the pixel region P is a region where an organic light emitting layer is formed to emit light, and the transistor region T is a region where a thin film transistor including the gate electrode 20, the source/drain electrode 24 and the semiconductor layer 14 is formed to apply a driving voltage to the organic light emitting layer of the pixel region P. Usable examples of the substrate 10 are the same as described above. The buffer layer 12 for preventing smoothness of the substrate 10 and infiltration of impurity is formed on the substrate 10.

Figure 4:
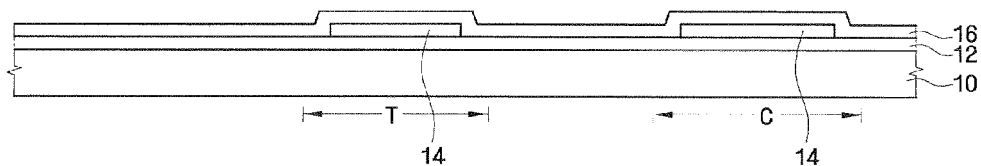

Next, referring to FIG. 4, the semiconductor layer 14 is formed on the buffer layer 12 and the gate insulation film 16 is formed thereon. As described above, the semiconductor layer 14 is formed on the transistor region T to form a thin film transistor, and is formed on the capacitor region C to form an electrode of a capacitor.

Amorphous silicon or polysilicon is provided on the entire surface of the substrate 10 having a transistor region T and a capacitor region C and silicon is removed from the substrate 10 excluding the transistor region T and the capacitor region C to allow the semiconductor layer 14 to remain. As described above, the semiconductor layer 14 forming the transistor region T and the capacitor region C may be made of the same material but doped with different impurities, the semiconductor layer 14 on the transistor region T may be partially doped with impurity, while the semiconductor layer 14 on the capacitor region C may be entirely doped with impurity, thereby forming a conductor.

Figure 5:
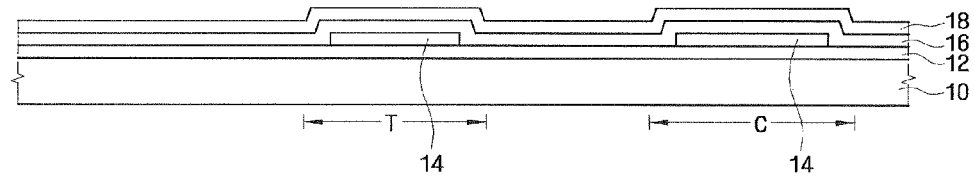
Figure 6:
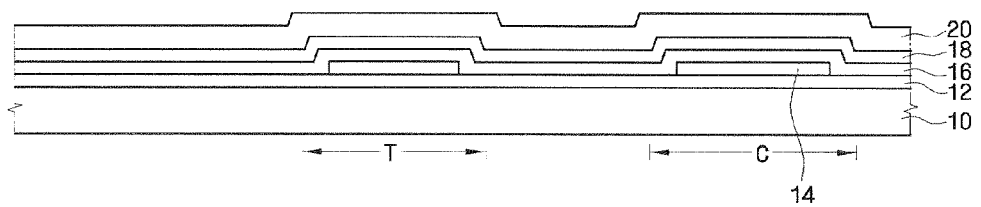

Next, referring to FIGS. 5 and 6, the transparent electrode 18 and the gate electrode 20 are provided on the gate insulation film 16. The transparent electrode 18 and the gate electrode 20 may be formed on the entire surface of the substrate 10. Since the transparent electrode 18 and the gate electrode 20 are continuously formed, they may be electrically connected to each other. However, the transparent electrode 18 and the gate electrode 20 may be electrically insulated from the lower semiconductor layer 14 due to the lower gate insulation film 16. As described above, the transparent electrode 18 may be made of a transparent conductive material such as ITO or IZO, and the gate electrode 20 may be made of a metal or a multiple metal layers stacked.

Figure 7A:
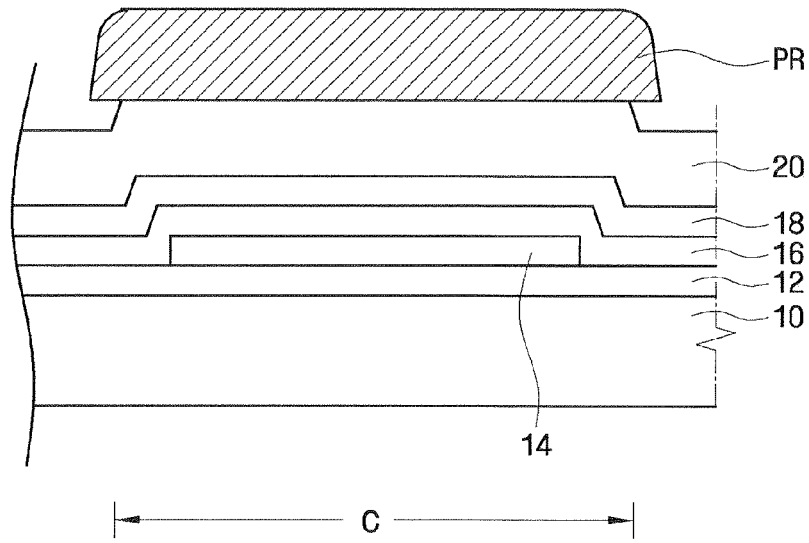
Figure 7B:
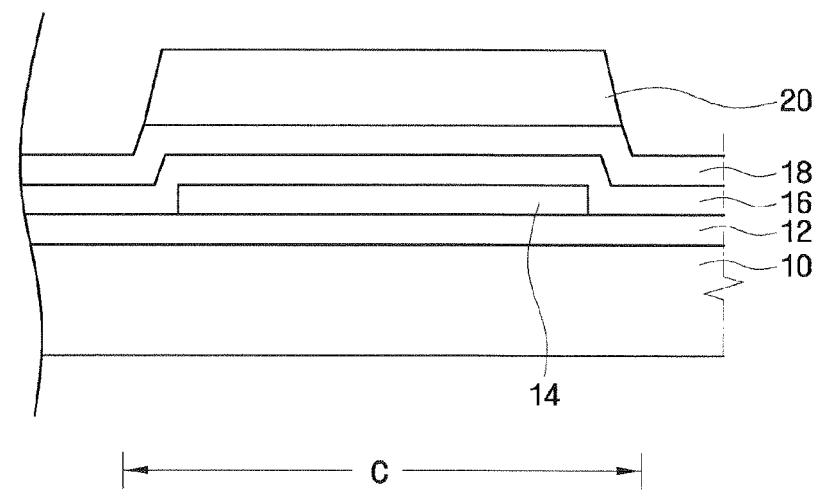
Figure 7C:
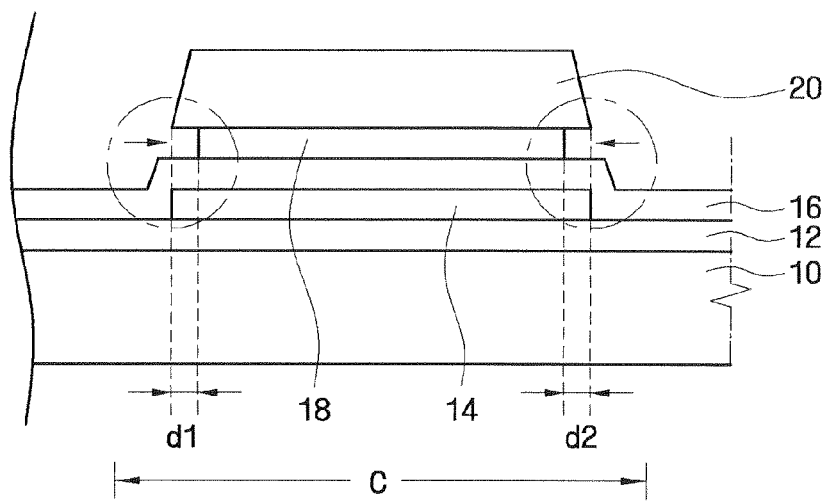

Referring to FIGS. 7a to 7c, the illustrated method for manufacturing an organic light emitting display device includes forming a first etching stopper film PR on a capacitor region C (FIG. 7a), etching a gate electrode 20 formed on a region other than a region of the first etching stopper film PR (FIG. 7b), removing the first etching stopper film PR and etching a transparent electrode 18 to be inwardly recessed into the gate electrode 20 using the gate electrode 20 as an etch mask (FIG. 7c).

The conventional method for manufacturing an organic light emitting display device includes forming an etching stopper film on the capacitor region C and blanket etching the gate electrode 20 and the transparent electrode 18. Therefore, the gate electrode 20 and the transparent electrode 18 are etched in a pyramidal configuration having a width of the etched structure increasing downwardly, as shown in FIG. 1a. That is to say, as the result of the blanket etching using an etching stopper film, such as photoresist, the lower transparent electrode 5 is left more than the upper gate electrode 6, which means that the width of the lower transparent electrode 5 is larger than the width of the upper gate electrode 6.

However, the illustrated method for manufacturing an organic light emitting display device, as shown in FIG. 7a, an etching stopper film PR is formed on the gate electrode 20, and only the gate electrode 20 is primarily etched, as shown in FIG. 7b. Here, the gate electrode 20 is etched using an etching solution for selectively wet etching. Next, the etching stopper film PR is removed and the lower transparent electrode 18 is secondarily etched using the gate electrode 20 patterned on the capacitor region C as a mask, as shown in FIG. 7c. Here, the transparent electrode 18 is etched using an etching solution for selectively wet etching.

In such a case, due to the wet etching, a layer positioned in the vicinity of a lower portion of an etching stopper mask is etched to be recessed a predetermined distance inwardly into the etching stopper mask. In addition, the farther from the etching stopper mask the layer is positioned, the more outwardly the layer is etched to protrude. As described above, the etching is performed in a pyramidal configuration. Since the transparent electrode 18 is positioned in the vicinity of a lower portion of the gate electrode 20 used as a mask, the transparent electrode 18 is etched for both ends to be recessed by d1 and d2, as shown in FIG. 7c. As a result, a width of the transparent electrode 18 is reduced by d1+d2, compared to the lower semiconductor layer 14. Thus, generation of ESD or electric short with respect to the lower semiconductor layer 14 may be suppressed. The transparent electrode may be recessed 0.6 μm or less inwardly into the gate electrode 20.

While the illustrated embodiment has been described with regard to the capacitor region C, the lower semiconductor layer 14 may also be etched inwardly by dual etching of the lower semiconductor layer 14 in the pixel region P. That is to say, the illustrated method for manufacturing an organic light emitting display device may include sequentially forming a gate insulation film 16, a transparent electrode 18 and a gate electrode 20 on the buffer layer 12 formed on the pixel region P of a substrate, forming an etching stopper film PR on the pixel region P, etching the gate electrode 20 formed on a region other than a region of the etching stopper film PR, and removing the etching stopper film PR and etching the transparent electrode 18 to be inwardly recessed into the gate electrode 20 using the gate electrode 20 as an etch mask. The other components forming the pixel region P are the same as described above.

Next, a method for manufacturing of an organic light emitting display device according to another embodiment of the present invention will be described with reference to FIGS. 8a to 9d. FIGS. 8a to 9d are cross-sectional views sequentially illustrating a method for manufacturing of an organic light emitting display device according to another embodiment of the present invention.

The illustrated method for manufacturing an organic light emitting display device may include forming a semiconductor layer 14 on a buffer layer 12 formed on a capacitor region C of a substrate including the capacitor region C and a transistor region T, sequentially forming a gate insulation film 16, a transparent electrode 18 and a gate electrode 20 on the semiconductor layer 14, forming a first etching stopper film PR on the capacitor region C, etching the gate electrode 20 formed on a region other than the first etching stopper film PR, removing the first etching stopper film PR and etching the transparent electrode 18 using the gate electrode 20 as an etch mask so that the transparent electrode 18 is inwardly recessed into the gate electrode 20, providing an interlayer dielectric film 22 on the substrate 10, forming a second etching stopper film PR on the transistor region T and etching the interlayer dielectric film 22 on a region other than a region of the second etching stopper film PR. In the etching of the interlayer dielectric film 22, the etching of the transparent electrode 18 is blocked by the gate electrode 20.

In the illustrated method for manufacturing an organic light emitting display, the process steps before the etching of the transparent electrode 18 to be recessed inwardly into the gate electrode 20 are the same as those of the previous embodiment, and a detailed description thereof will be omitted.

The illustrated method for manufacturing an organic light emitting display may further include providing an interlayer dielectric film 22 on the substrate 10, forming a second etching stopper film PR on the transistor region T and etching the interlayer dielectric film 22 formed on a region other than a region of the second etching stopper film PR. In the etching of the interlayer dielectric film 22, the transparent electrode 18 is prevented from being etched by the gate electrode 20.

Figure 8A:
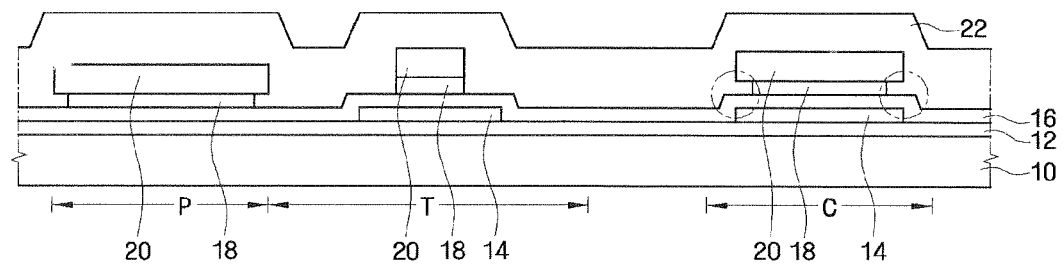
FIGS. 8a to 9d are cross-sectional views sequentially illustrating a method for manufacturing of an organic light emitting display device according to another embodiment of the present invention.

First, referring to FIG. 8a, the interlayer dielectric film 22 is formed on the gate electrode 20. As shown in FIG. 8a, the interlayer dielectric film 22 is provided on the entire surface of the substrate 10 having a pixel region P, a transistor region T and a capacitor region C. The interlayer dielectric film 22 electrically insulates the transparent electrode 18, the gate electrode 20 and the source/drain electrode 24 from each other in the transistor region T.

Figure 8B:
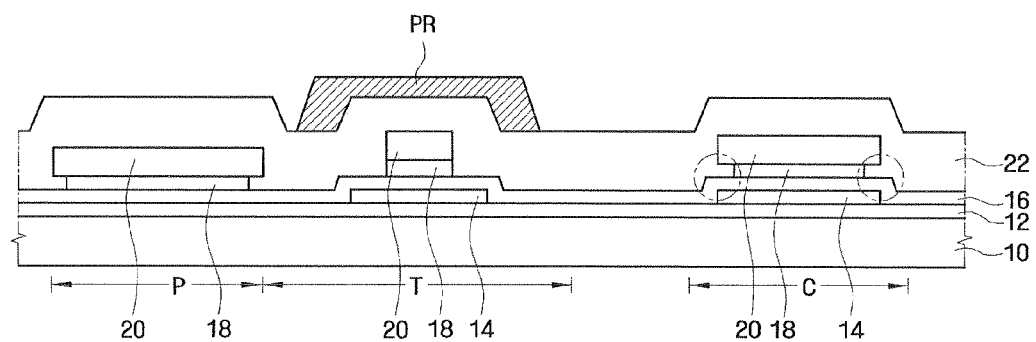

The interlayer dielectric film 22 is formed on the entire surface of the substrate 10, and an etching stopper film PR is formed on the transistor region T to remove the interlayer dielectric film 22 formed on the region other than the transistor region T, as shown in FIG. 8*b*.

Next, as shown in FIG. 8*c*, the interlayer dielectric film 22 provided on the region other than the transistor region T having the etching stopper film PR is etched for removal. The interlayer dielectric film 22 may be etched by dry etching.

In the conventional process of etching the interlayer dielectric film 22, the interlayer dielectric film 22 in the capacitor region C and the interlayer dielectric film 22 in the pixel region P may be removed and the transparent electrode 18 may also be partially etched, producing a conductive byproduct, thereby generating ESD and electric short.

In the process of etching the interlayer dielectric film 22 according to the illustrated embodiment, as shown in FIG. 8*c*, dual etching of the gate electrode 20 and the transparent electrode 18 allows the transparent electrode 18 to be recessed inwardly into the gate electrode 20, thereby preventing the transparent electrode 18 from being etched due to an etchant of the interlayer dielectric film 22 (refer to a region indicated by a dotted line). That is to say, when the interlayer dielectric film 22 is etched for patterning, the transparent electrode 18 is recessed inwardly by d1+d2 with respect to the upper gate electrode 20, thereby preventing a byproduct from being generated due to the etching of the transparent electrode 18 and suppressing generation of defective pixels.

Next, referring to FIGS. 9*a* to 9*d*, the illustrated method for manufacturing an organic light emitting display may further include providing a source/drain electrode 24 on the substrate 10, forming an etching stopper film PR on the transistor region T and etching the source/drain electrode 24 formed on a region other than a region of the etching stopper film PR.

That is to say, the source/drain electrode 24 is formed on the entire surface of the substrate 10, and the etching stopper film PR for patterning the source/drain electrode 24 is formed on the transistor region T. Next, the source/drain electrode 24 is patterned using the etching stopper film PR as a mask, thereby forming the source/drain electrode 24 having a desired shape.

The etching of the source/drain electrode 24 may include etching the gate electrode formed on the capacitor region to allow the transparent electrode to be exposed to the outside.

Figure 9A:
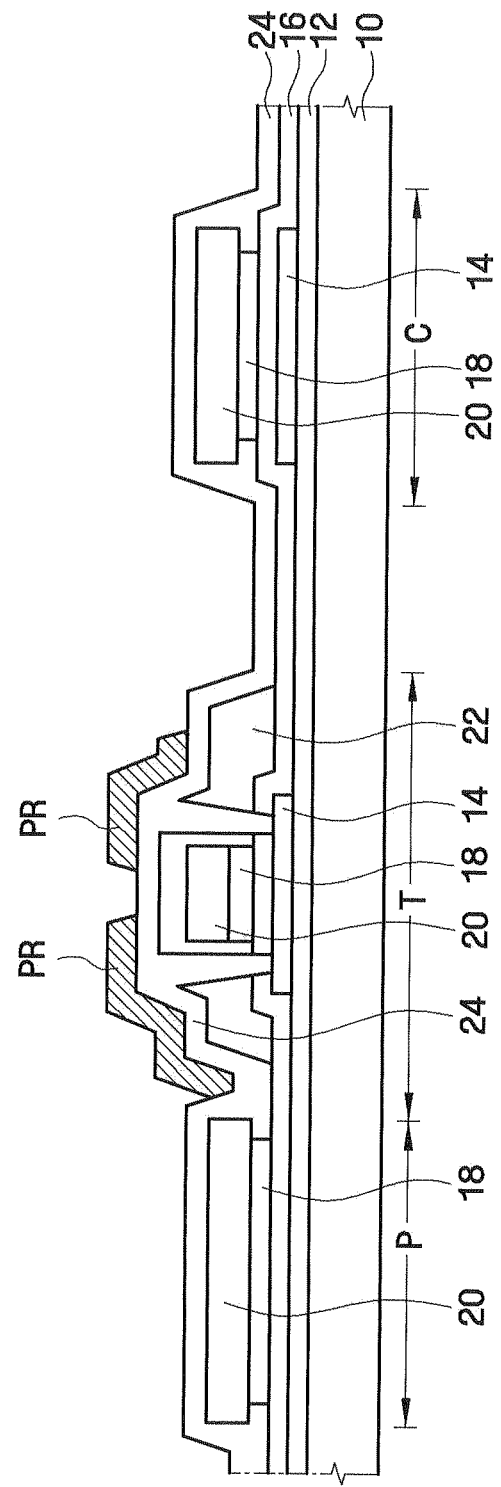
Figure 9B:
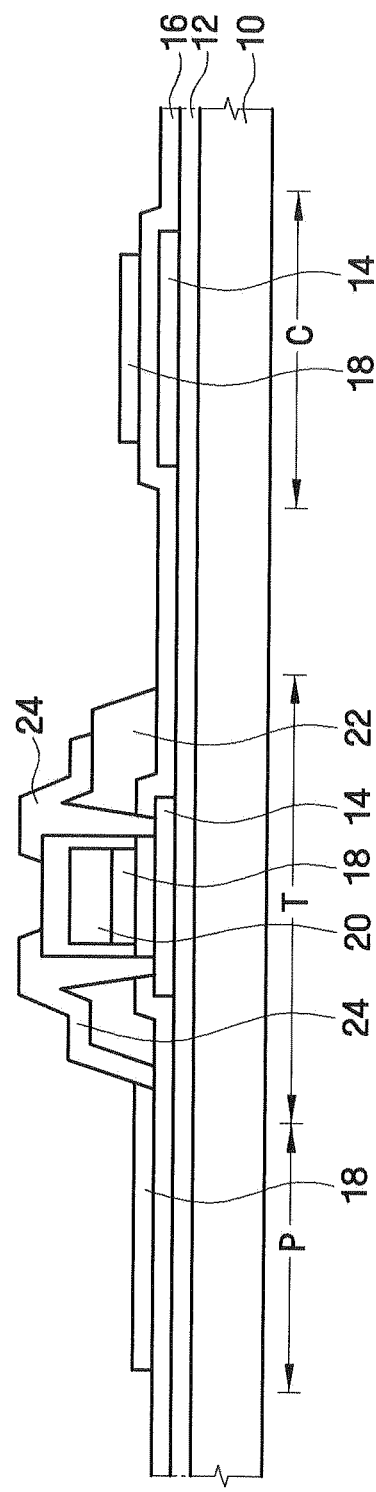

That is to say, as shown in FIG. 9*b*, the gate electrode 20 formed on the capacitor region C and the source/drain electrode 24 formed on the pixel region. P may be collectively removed by a single etching process. To facilitate the collective etching using a single etching process, the gate electrode 20 and the source/drain electrode 24 may be made of the same material. For example, in a case where the gate electrode 20 has a triple layered structure of molybdenum-aluminum-molybdenum (Mo—Al—Mo), the source/drain electrode 24 may also have a triple layered structure of molybdenum-aluminum-molybdenum (Mo—Al—Mo). In addition, a six-layered structure of the gate electrode 20 and the source/drain electrode 24 may be collectively etched using a single etching solution.

Figure 9C:
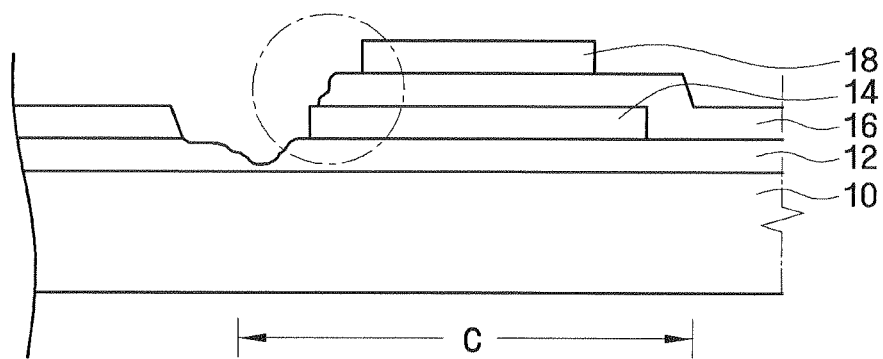

Referring to FIG. 9*c*, the upper transparent electrode 18 is configured in the capacitor region C such that it is recessed inwardly because a width thereof is smaller than that of the lower semiconductor layer 14, unlike in FIG. 1*b*. In addition, even when the gate insulation film 16 or the buffer layer 12 is partially damaged during an etching process to expose the semiconductor layer 14, it is separated from the upper transparent electrode 18, thereby allowing the semiconductor layer 14 to be electrically insulated from the upper transparent electrode 18 and preventing an electrical short between the semiconductor layer 14 and the upper transparent electrode 18.

Figure 9D:
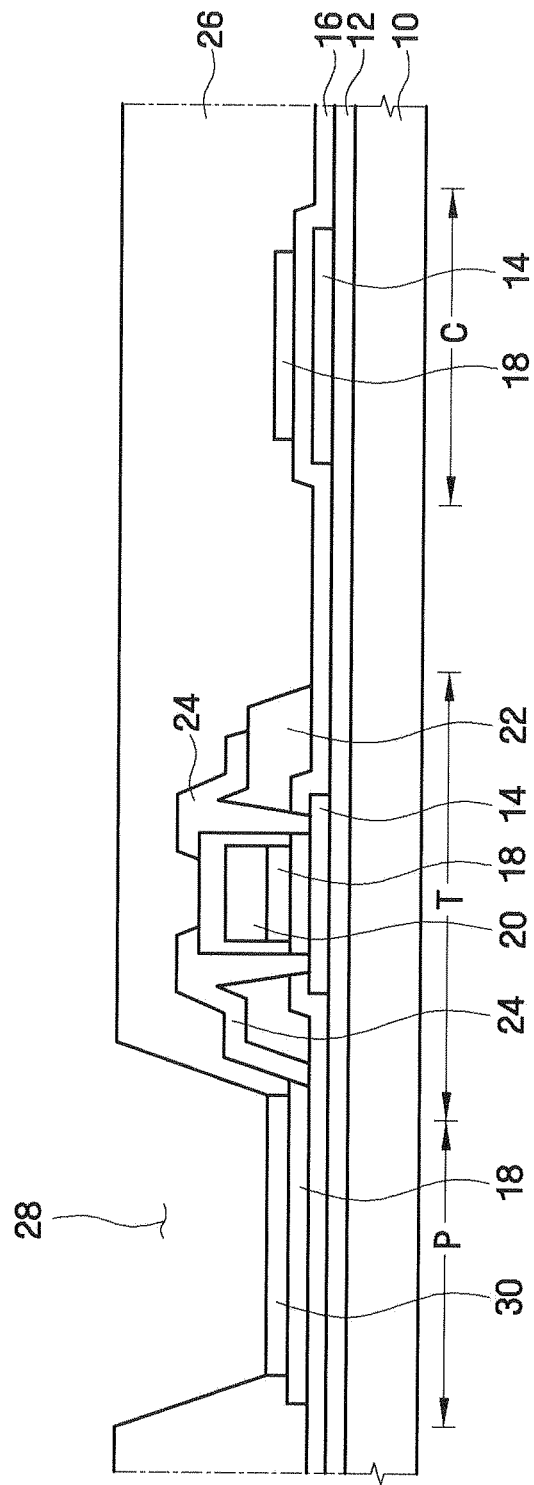

Next, referring to FIG. 9*d*, a pixel defining layer (PDL) 26 that defines a pixel region P on the substrate 10 is formed on the entire surface of the substrate 10 to then form an opening portion 28. Then, an organic light emitting layer 30 is formed on the transparent electrode 18 exposed through the opening portion 28 to form a pixel portion.

While the present invention has been particularly shown and described with reference to exemplary embodiments thereof, it will be understood by those of ordinary skill in the art that various changes in form and details may be made therein without departing from the spirit and scope of the present invention as defined by the following claims. It is therefore desired that the present embodiments be considered in all respects as illustrative and not restrictive, reference being made to the appended claims rather than the foregoing description to indicate the scope of the invention.

What is claimed is:

1. An organic light emitting display device comprising:
    a substrate including a capacitor region;
    a first electrode disposed on the substrate of the capacitor region;
    an insulation film formed on the the first electrode; and
    a second electrode formed on the insulation film of the capacitor region, wherein a cross-sectional width of the second electrode is smaller than that of the first electrode, wherein a width difference between the first electrode and the second electrode is 0.6 μm or less.

2. The organic light emitting display device of claim 1, wherein the second electrode includes at least one selected from the group consisting of indium tin oxide (ITO) and indium zinc oxide (IZO).

3. The organic light emitting display device of claim 1, wherein the first electrode is made of polysilicon.

4. The organic light emitting display device of claim 1, wherein the first electrode includes semiconductor.

5. The organic light emitting display device of claim 1, wherein the second electrode includes at least one selected from the group consisting of indium tin oxide (ITO) and indium zinc oxide (IZO).

6. An organic light emitting display device comprising:
    a substrate including a capacitor region and a transistor region;
    a buffer layer disposed on the substrate;
    a semiconductor layer disposed on the buffer layer of the capacitor region and the buffer layer of the transistor region;
    a gate insulation film formed on the semiconductor layer;
    a transparent electrode formed on the gate insulation film of the capacitor region and the gate insulation film of the transistor region;
    a gate electrode formed on the transparent electrode of the transistor region; and
    a source/drain electrode disposed on the gate electrode while being insulated from the gate electrode, and connected to the semiconductor layer of the transistor region through a contact hole, wherein a cross-sectional width of the transparent electrode of the capacitor region is smaller than that of the semiconductor layer of the capacitor region.

7. The organic light emitting display device of claim 6, wherein the gate electrode is formed of a single layer or multiple layers formed of a material selected from the group consisting of aluminum (Al), a chrome-aluminum (Cr—Al) alloy, and a molybdenum-aluminum (Mo—Al) alloy.

8. The organic light emitting display device of claim 6, wherein the source/drain electrode is formed of a single layer or multiple layers formed of a material selected from the group consisting of aluminum, a chrome-aluminum (Cr—Al) alloy, and a molybdenum-aluminum (Mo—Al) alloy.

9. The organic light emitting display device of claim 6, wherein the transparent electrode includes at least one selected from the group consisting of indium tin oxide (ITO) and indium zinc oxide (IZO).

10. The organic light emitting display device of claim 6, wherein the semiconductor layer is made of polysilicon.

11. The organic light emitting display device of claim 6, wherein a difference between the cross-sectional widths of the transparent electrode and the semiconductor layer is 0.6 µm or less.

12. A method for manufacturing an organic light emitting display device, the method comprising:
    forming a first electrode on a buffer layer on a capacitor region of a substrate including the capacitor region, the buffer layer disposed on the substrate, the first electrode disposed on the substrate of the capacitor region;
    sequentially forming an insulation film, a second electrode and a gate electrode on the first electrode;
    forming a first etching stopper film on the capacitor region;
    etching the gate electrode formed on a region other than the first etching stopper film; and
    removing the first etching stopper film and etching the second electrode using the gate electrode as an etch mask so that the second electrode is inwardly recessed into the gate electrode, the second electrode formed on the insulation film of the capacitor region, a cross-sectional width of the second electrode being smaller than that of the first electrode, a width difference between the first electrode and the second electrode being 0.6 µm or less.

13. The method of claim 12, wherein the etching of the gate electrode is performed by wet etching using an etching solution for selectively etching the gate electrode.

14. The method of claim 12, wherein the etching for the second electrode to be inwardly recessed is performed by wet etching using an etching solution for selectively etching the second electrode.

15. A method for manufacturing an organic light emitting display device, the method comprising:
    forming a semiconductor layer on a buffer layer formed on the capacitor region of a substrate having a capacitor region and a transistor region, the buffer layer disposed on the substrate, the semiconductor layer disposed on the buffer layer of the capacitor region and the buffer layer of the transistor region;
    sequentially forming a gate insulation film, a transparent electrode and a gate electrode on the semiconductor layer, the transparent electrode formed on the gate insulation film of the capacitor region and the gate insulation film of the transistor region;
    forming a first etching stopper film on the capacitor region;
    etching a gate electrode formed on a region other than a region of the first etching stopper film;
    removing the first etching stopper film and etching the transparent electrode to be inwardly recessed relative to the gate electrode using the gate electrode as an etch mask;
    providing an interlayer dielectric film on the substrate;
    forming a second etching stopper film on the transistor region and etching the interlayer dielectric film formed on a region other than a region of the second etching stopper film, wherein in the etching of the interlayer dielectric film, the transparent electrode is prevented from being etched by the gate electrode; and
    providing a source/drain electrode on the substrate, the gate electrode formed on the transparent electrode of the transistor region, the source/drain electrode disposed on the gate electrode while being insulated from the gate electrode, and connected to the semiconductor layer of the transistor region through a contact hole, wherein a cross-sectional width of the transparent electrode of the capacitor region is smaller than that of the semiconductor layer of the capacitor region.

16. The method of claim 15, wherein the transparent electrode is inwardly recessed into the gate electrode by 0.6 µm or less.

17. The method of claim 15, wherein the etching of the gate electrode is performed by wet etching using an etching solution for selectively etching the gate electrode.

18. The method of claim 15, wherein the etching for the transparent electrode to be inwardly recessed is performed by wet etching using an etching solution for selectively etching the transparent electrode.

19. The method of claim 15, further comprising:
    forming a third etching stopper film on the transistor region and etching the source/drain electrode formed on a region other than the third etching stopper film.

20. The method of claim 19, wherein the etching of the source/drain electrode comprises allowing the transparent electrode to be exposed to the outside by etching the gate electrode formed on the capacitor region.

21. The method of claim 20, wherein the gate electrode and the source/drain electrode are simultaneously etched by performing etching one time.

22. An organic light emitting display device, comprising:
    a gate insulation film, a transparent electrode and a gate electrode sequentially formed on a buffer layer formed on a pixel region of a substrate, with the gate electrode etched except for a region where an etching stopper film is formed; and
    a source/drain electrode disposed on the gate electrode while being insulated from the gate electrode, and connected to a semiconductor layer of a transistor region through a contact hole, wherein a cross-sectional width of the transparent electrode of a capacitor region is inwardly recessed into the gate electrode and is smaller than that of the semiconductor layer of the capacitor region.

23. The organic light emitting display device of claim 22, wherein the transparent electrode is inwardly recessed into the gate electrode by 0.6 µm or less.

24. The organic light emitting display device of claim 22, wherein the gate electrode is formed by wet etching using an etching solution for selectively etching the gate electrode.

25. The organic light emitting display device of claim 22, wherein the transparent electrode includes at least one selected from the group consisting of indium tin oxide (ITO) and indium zinc oxide (IZO), the semiconductor layer is made of polysilicon, and a difference between the cross-sectional widths of the transparent electrode and the semiconductor layer is 0.6 µm or less.

* * * * *